(12) United States Patent
Ma

(10) Patent No.: US 8,079,851 B1
(45) Date of Patent: Dec. 20, 2011

(54) SOCKET WITH LOWER CONTACT

(75) Inventor: Hao-Yun Ma, Tu-Cheng (TW)

(73) Assignee: Hon Hai Precision Ind. Co., Ltd., New Taiepi (TW)

( * ) Notice: Subject to any disclaimer, the term of this patent is extended or adjusted under 35 U.S.C. 154(b) by 0 days.

(21) Appl. No.: 12/944,653

(22) Filed: Nov. 11, 2010

(51) Int. Cl.
*H01R 12/00* (2006.01)

(52) U.S. Cl. .......................................... 439/83; 439/862

(58) Field of Classification Search ..................... 439/83, 439/66, 71, 81, 861, 862
See application file for complete search history.

(56) References Cited

U.S. PATENT DOCUMENTS

| | | | |
|---|---|---|---|
| 5,199,554 A | * | 4/1993 | Kano et al. .................... 200/283 |
| 5,879,169 A | * | 3/1999 | Wu .................................. 439/74 |
| 5,980,323 A | * | 11/1999 | Bricaud et al. ................ 439/630 |
| 5,997,317 A | * | 12/1999 | Pei et al. ......................... 439/83 |
| 6,731,516 B1 | | 5/2004 | Ma |
| 6,758,702 B2 | * | 7/2004 | Johnescu ....................... 439/862 |
| 6,976,851 B2 | | 12/2005 | Huang |
| 2009/0137136 A1 | * | 5/2009 | Shen ............................... 439/83 |

* cited by examiner

*Primary Examiner* — Phuong Dinh
(74) *Attorney, Agent, or Firm* — Andrew C. Cheng; Wei Te Chung; Ming Chieh Chang

(57) ABSTRACT

A socket, for connecting an IC (integrated circuit) package to a printed circuit board, has an insulative housing and a plurality of contacts assembled to the insulative housing. The insulative housing defines a plurality of holes and a plurality of retaining slots. The contact is assembled to the insulative housing from the bottom to the top, and each contact has a horizontal main body, an oblique arm extending upwardly and forwardly from a front edge of the horizontal main body and received in the hole and a pair of retaining tabs extending upwardly from two opposite lateral edges of the horizontal main body, respectively, and interfering with the retaining slot of the insulative housing to retain the contact on the insulative housing.

20 Claims, 20 Drawing Sheets

SOCKET WITH LOWER CONTACT

BACKGROUND OF THE INVENTION

1. Field of the Invention

The present invention relates to a socket, especially to a socket adapted for electrically connecting an IC (integrated Circuit) package to a printed circuit board and having lower contacts.

2. Description of the Related Art

To electrically connect to a printed circuit board, an IC (integrated Circuit) package usually need a socket disposed between the IC package and the printed circuit board and electrically connecting with the IC package and the printed circuit board, respectively, for transferring signals between the IC package and the printed circuit board.

A BGA (Ball Grid Array) socket is most popular in those sockets, U.S. Pat. No. 6,976,851 discloses such a socket, which usually comprises an insulative housing defining a plurality of passageways through the insulative housing and a plurality of contacts received in the passageways. The contact is formed with a retaining portion retained in the passageway, a contacting portion upwardly extending from the retaining portion to electrically contact with the IC package and a solder portion downwardly extending from the retaining portion to electrically contact with the printed circuit board. This socket can provide a lower impedance and reliably mechanical and electrical performance thereof. However, for customs' requirements, more and more electrical equipments become smaller and thinner, and the socket also needs to follow this trend. But that is a not simple problem for the contact, because the contact must have a contacting portion with certain length to provide enough elasticity and a retaining portion to retain the contact in the insulative housing, and both the two portions will increase a height of the socket.

Hence, an improved socket is required to overcome the disadvantages of the prior art.

SUMMARY OF THE INVENTION

An object of the invention is to provide a socket, which provides a socket with a thinner configuration.

To achieve the above-mentioned object, a socket, for connecting an IC (integrated circuit) package to a printed circuit board, comprises an insulative housing and a plurality of contact. The insulative housing defines a plurality of holes and a plurality of retaining slots. The contact has a horizontal main body, an oblique arm extending upwardly and forwardly from a front edge of the horizontal main body with a contacting portion at the top thereof and a pair of retaining tabs extending upwardly from two opposite lateral edges of the horizontal main body, respectively. The contact is assembled to the insulative housing from the bottom to the top, the horizontal main body faces to a bottom surface of the insulativre housing, the oblique arm is received in the hole and the retaining tabs interfer with the retaining slot of the insulative housing to retain the contact on the insulative housing.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
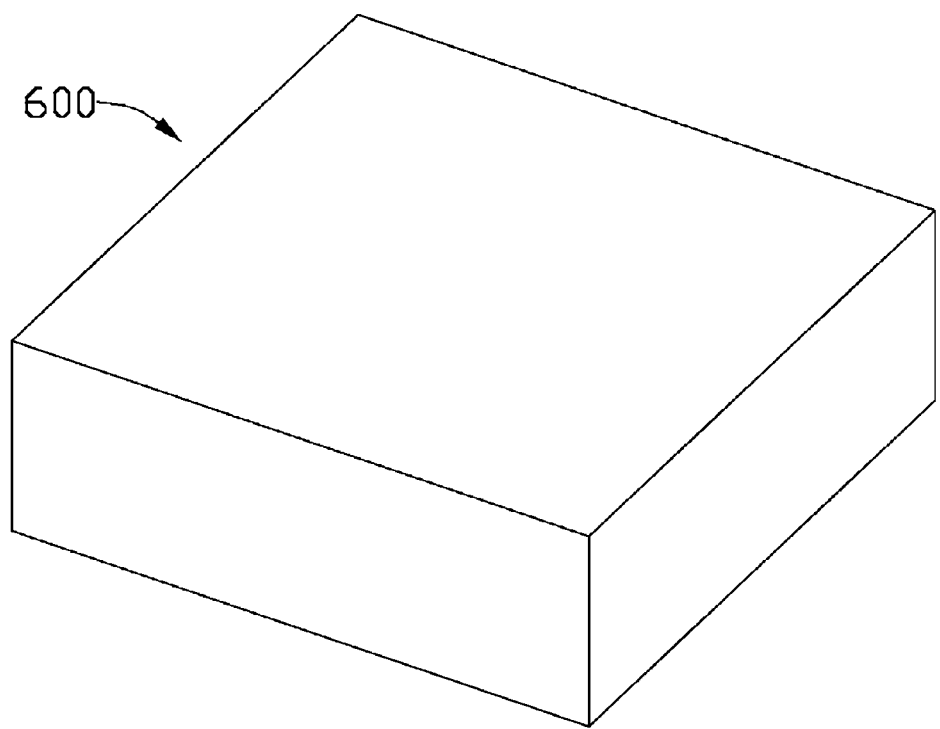
FIG. 1 is an assembled, perspective view of a socket in accordance with a first preferred embodiment of present invention.
Figure 1:
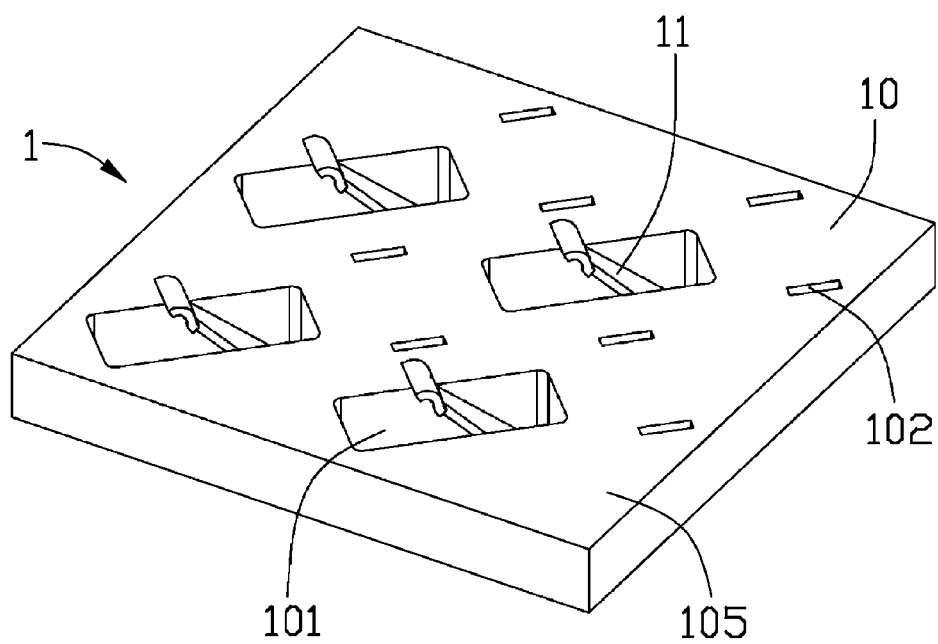
Figure 2:
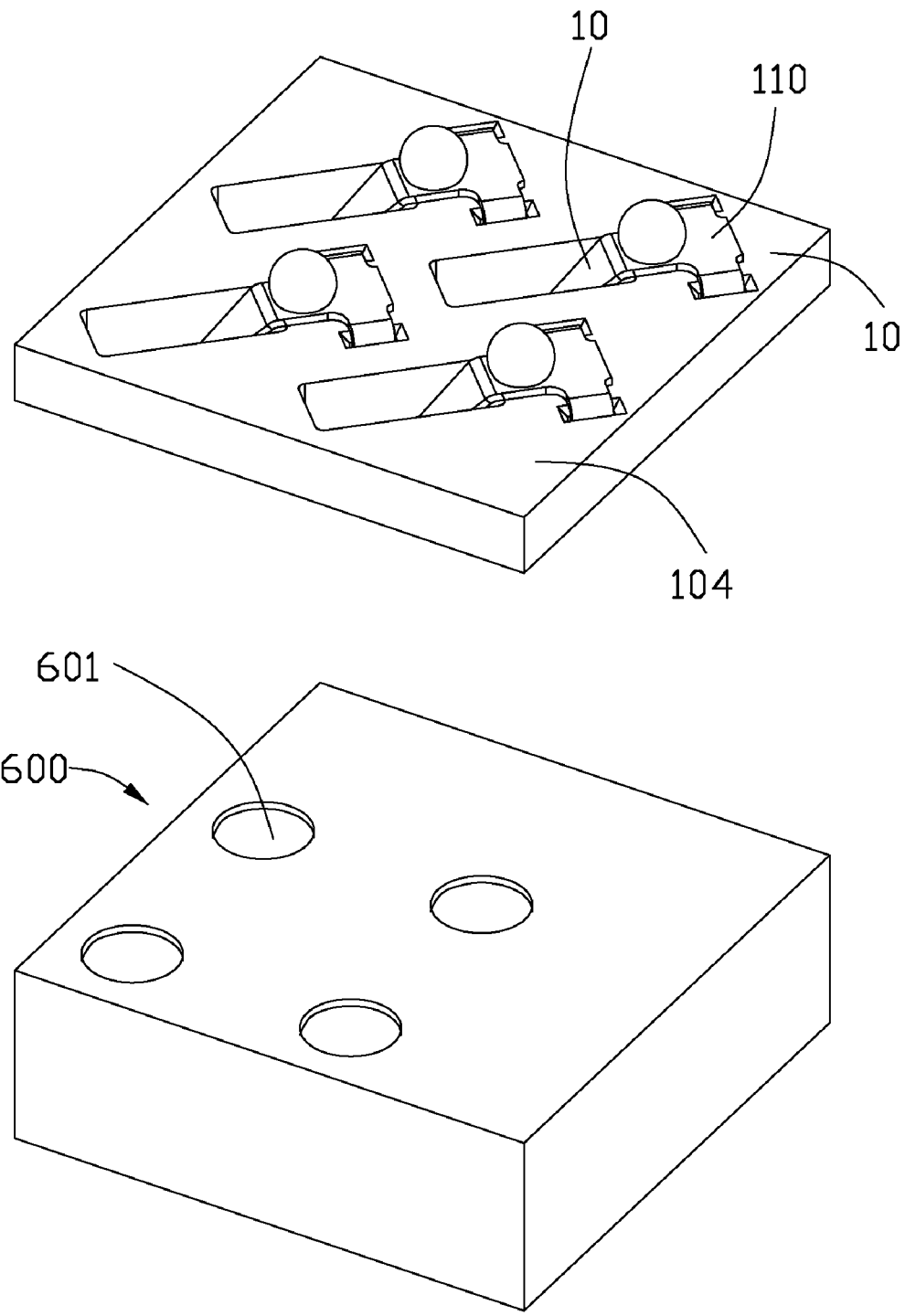
FIG. 2 is similar with FIG. 1, but taken from another side.
Figure 3:
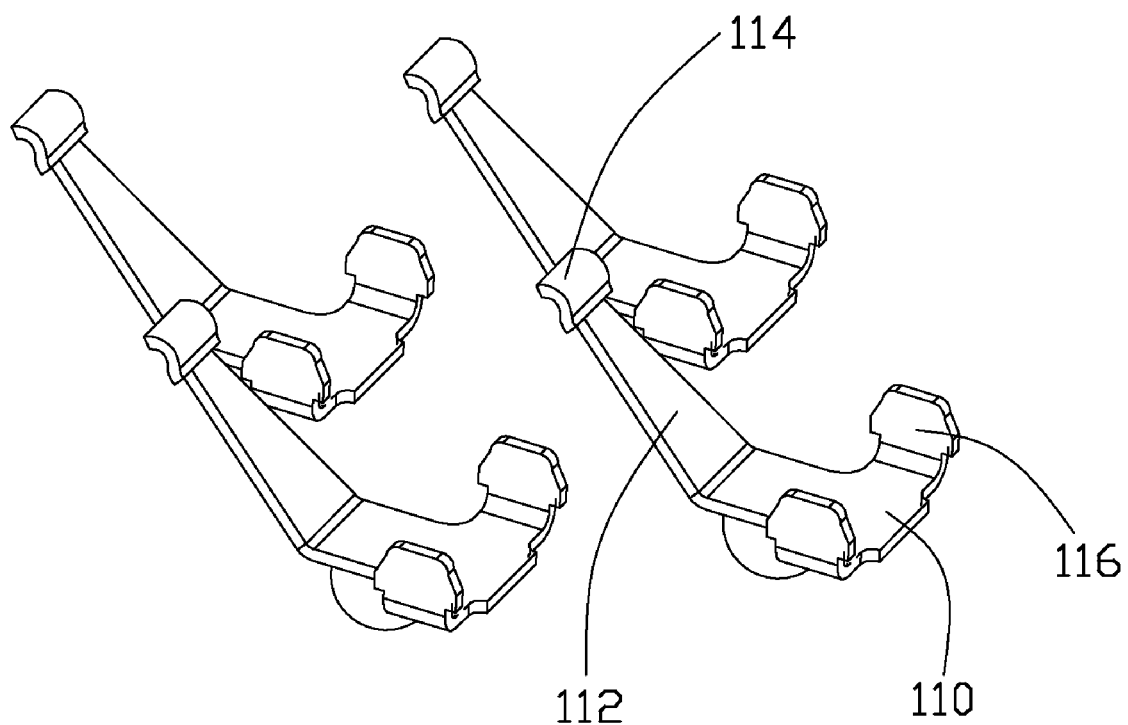
FIG. 3 is a perspective view of contacts of the socket in FIG. 1.
Figure 4:
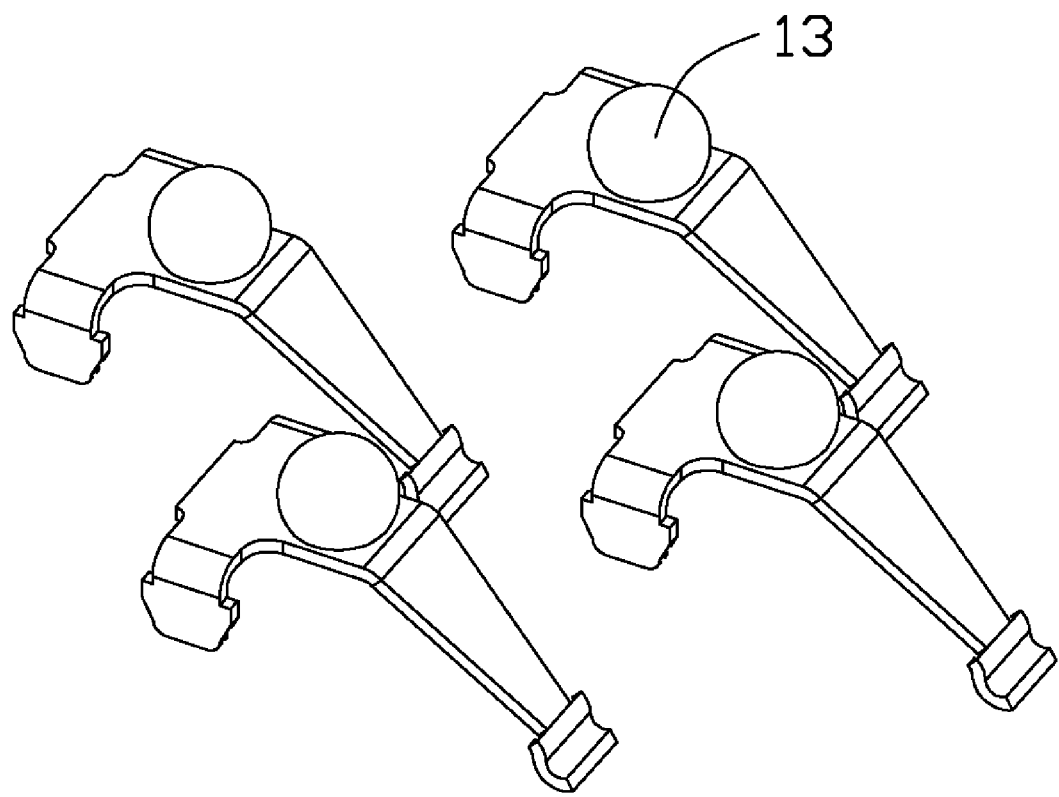
FIG. 4 is an another perspective view of the contacts in FIG. 3.

Reference will now be made in detail to the preferred embodiments of the present invention.

Referring to FIGS. 1-4, a socket 1 in accordance with a first preferred embodiment of present invention is adapted for electrically connecting an IC (integrated Circuit) package 600 to a printed circuit board (not shown).

The socket 1 has an insulative housing 10 and a plurality of contacts 11 received in the insulating housing 10. The insulative housing 10 defines a plurality of holes 101 for receiving the contacts 11 and a plurality of retaining slots 102 around the holes 101, both the hole 101 and the retaining slot 102 pass through the insulative housing 10 and the retaining slots 102 are separated with the holes 101. The contact 11 has a horizontal main body 110 which has a substantial rectangular shape with a front and a rear edges and two opposite lateral edges, an oblique arm 112 extending upwardly and forwardly from the front edge of the horizontal main body 110 and having a contacting portion 114 at the top thereof and a pair of retaining tabs 116 extending upwardly from the two opposite lateral edges of the horizontal main body 110, respectively. A solder ball 13 is attached to a bottom of the horizontal main body 110.

The contact 11 is assembled to the insulative housing 10 from the bottom to the top, the main body 110 faces to or abuts against a bottom surface 104 of the insulative housing 10, the oblique arm 112 is received in the holes 101 with the contacting portion 114 extending beyond a top surface 105 of the insulative housing 10 to contact with corresponding conductive pads 601 formed on the IC package 600, and the retaining tabs 116 mechanically interfere with the retaining slots 102 of the insulative housing 10 to retain the contact 11 to the insulative housing 10. Since the retaining tabs 116 is designed to extend upwardly from the horizontally main body 110, whole the retaining tab 116 is located within a scope of a height of the oblique arm 112, that means the retaining tab 116 will not bring an additional size to the height of the whole contact 11, the contact 11 and the socket 1 can have a lower configuration.

Figure 5:
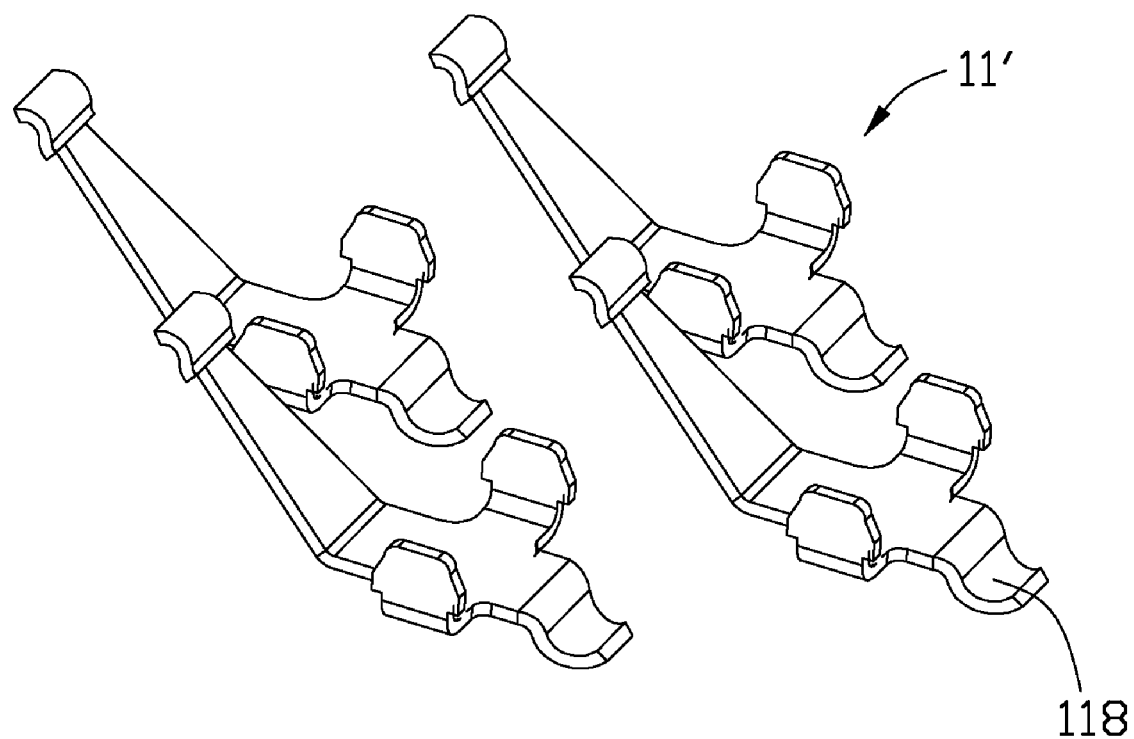
FIG. 5 is a perspective view of an alternative contact of the socket in the first preferred embodiment of present invention.
Figure 6:
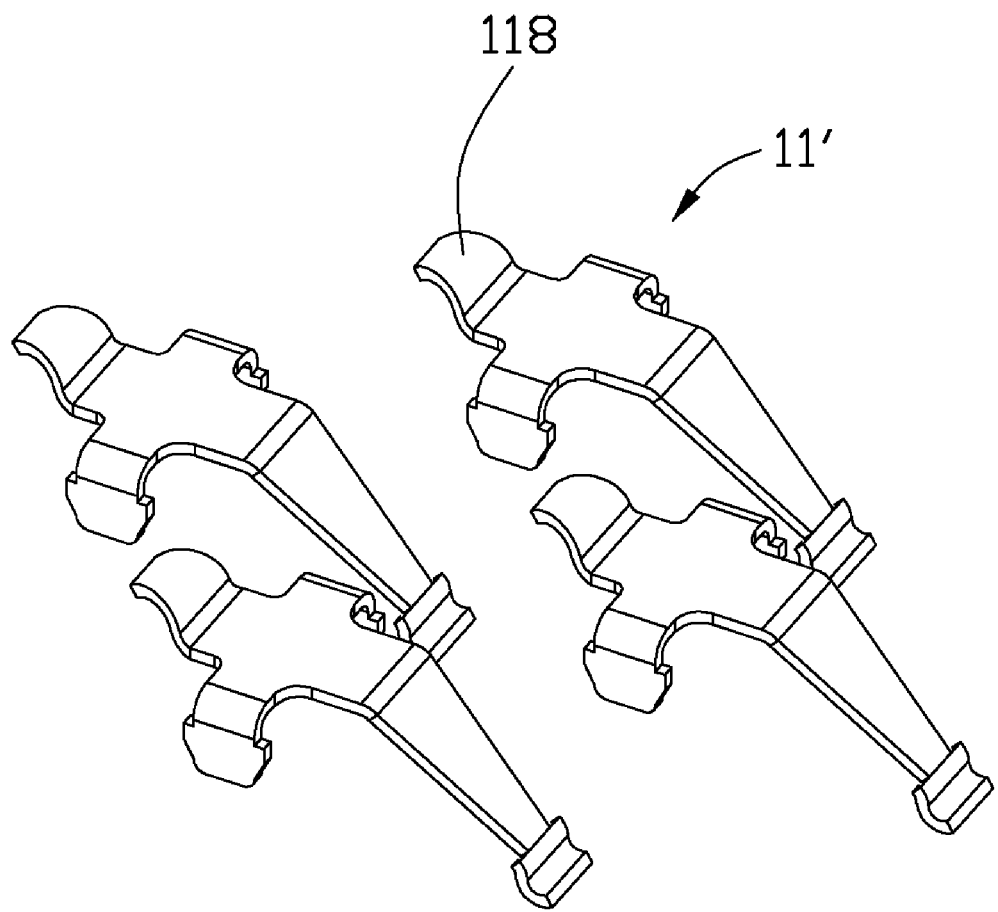
FIG. 6 is another perspective view of the alternative contact in FIG. 5.

Conjoined with FIGS. 5-6, an alternative contact 11' adapted for the socket 1 mentioned above is disclosed. The contact 11' has a substantial same configuration of the contact 11, the only difference is that a curved tail 118 extending downwardly and rearward from a rear edge of the main body 110 to press the printed circuit board (not shown), and the solder ball 13 is not needed.

Figure 7:
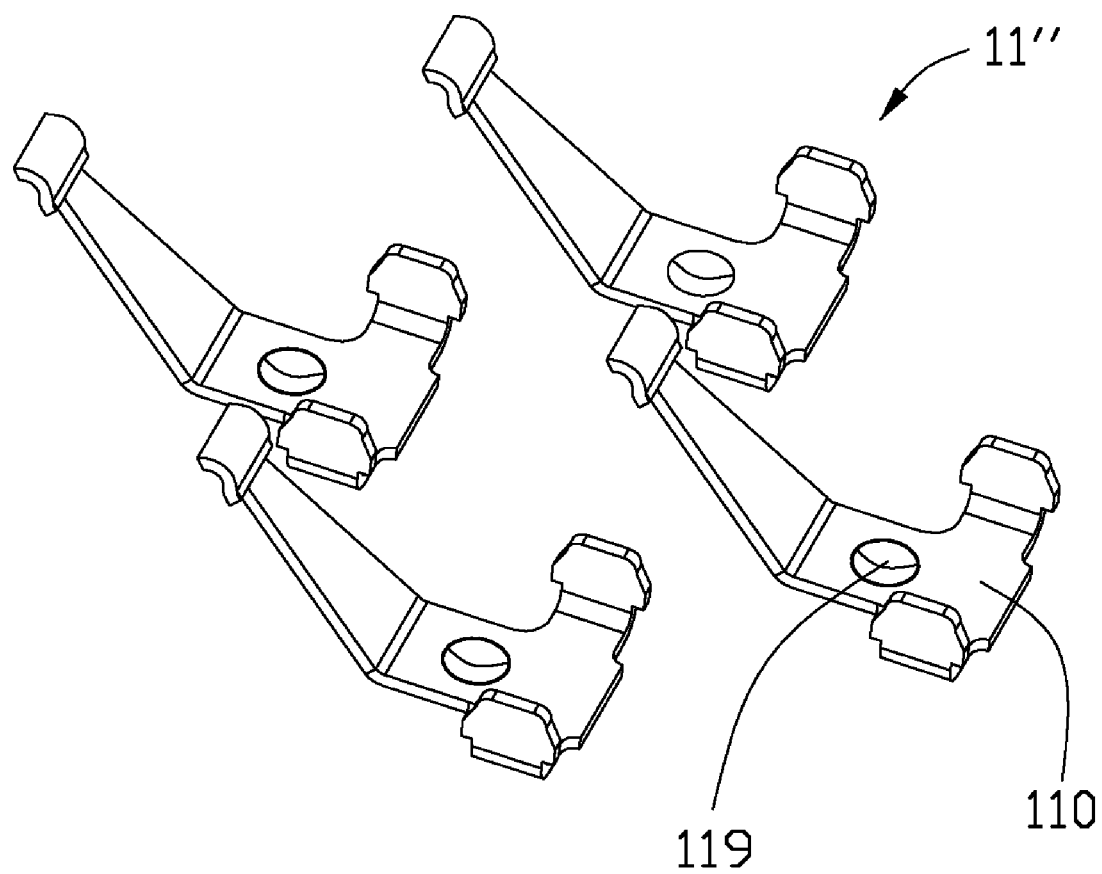
FIG. 7 is a perspective view of another alternative contact of the socket in the first preferred embodiment of present invention.
Figure 8:
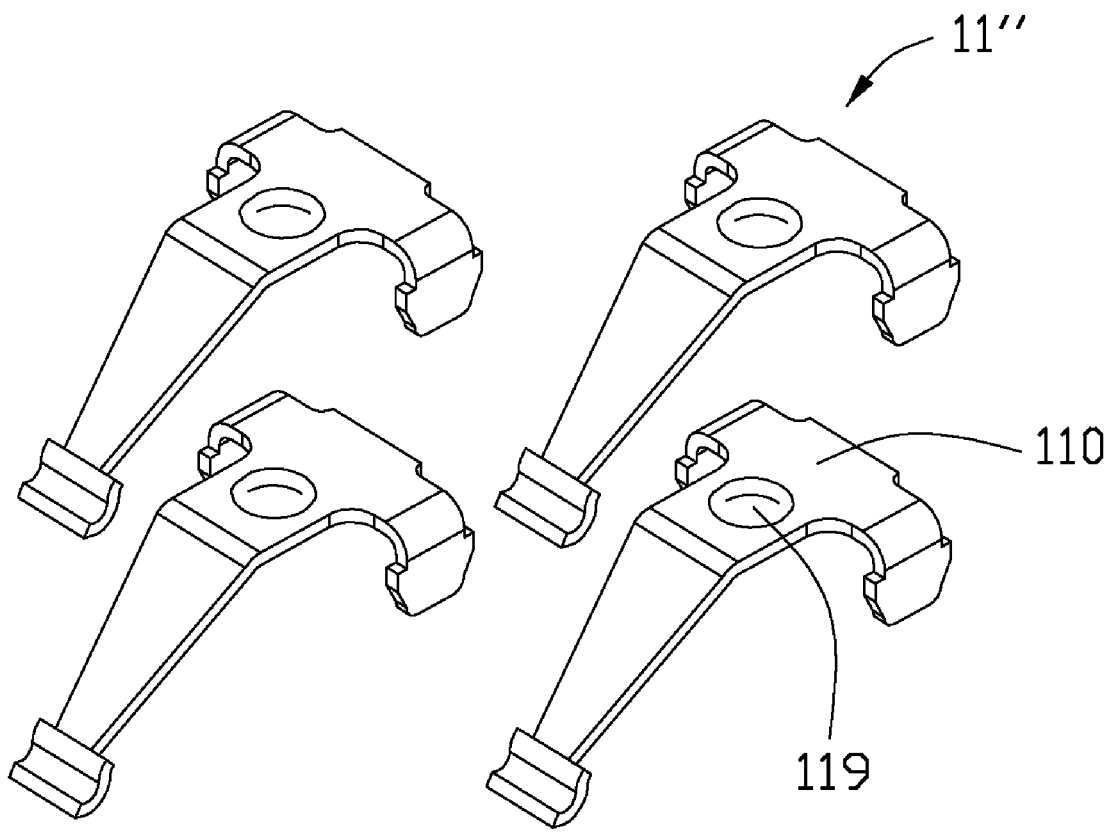
FIG. 8 is another perspective view of the another alternative contact in FIG. 7.

Referring to FIGS. 7-8, another alternative contact 11" adapted for the socket 1 mentioned above is disclosed. The contact 11" has a substantial same configuration of the contact 11, the only difference is that the main body 110 of the contact 11" is provided with a dimple 119 in a center thereof to abut against the printed circuit board (not shown), and the solder ball 13 is not needed.

Figure 9:
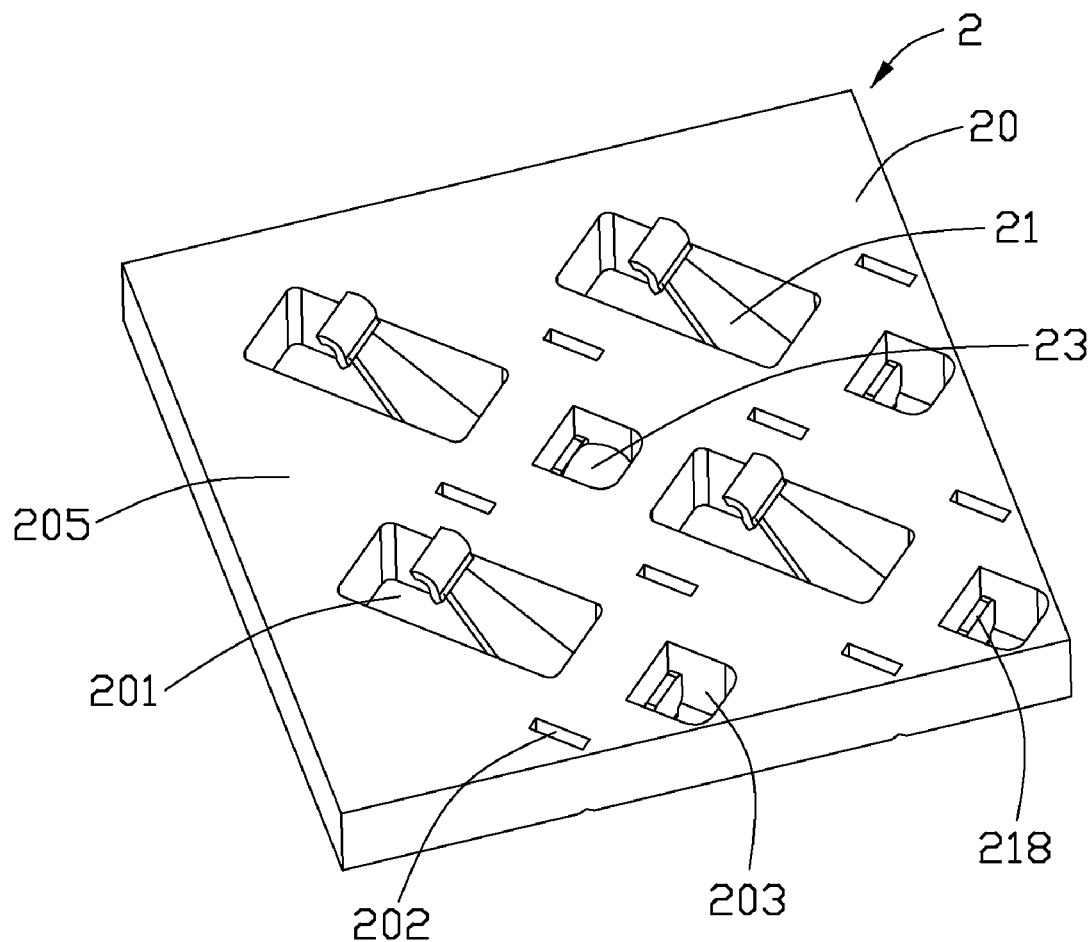
FIG. 9 is an assembled, perspective view of a socket in accordance with a second preferred embodiment of present invention.
Figure 10:
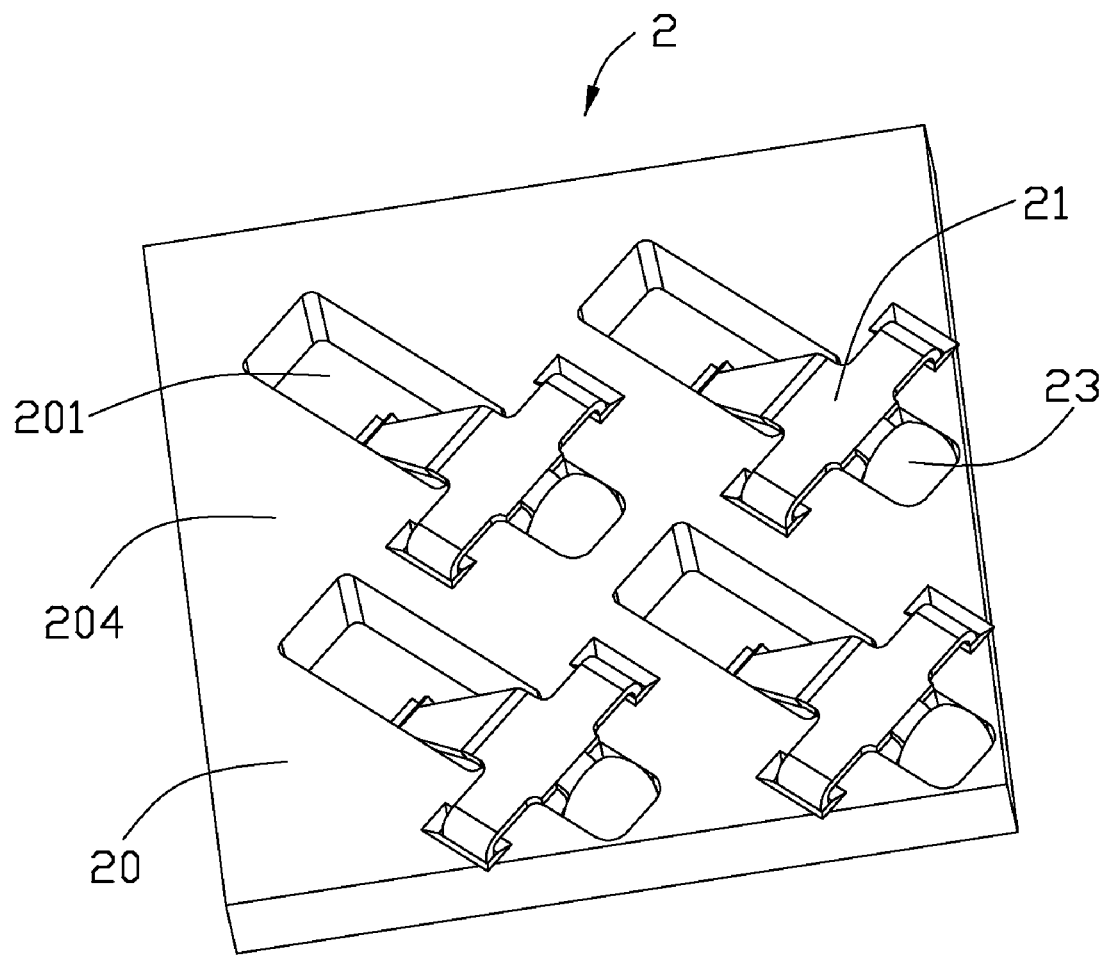
FIG. 10 is another perspective view of the socket in FIG. 9.
Figure 11:
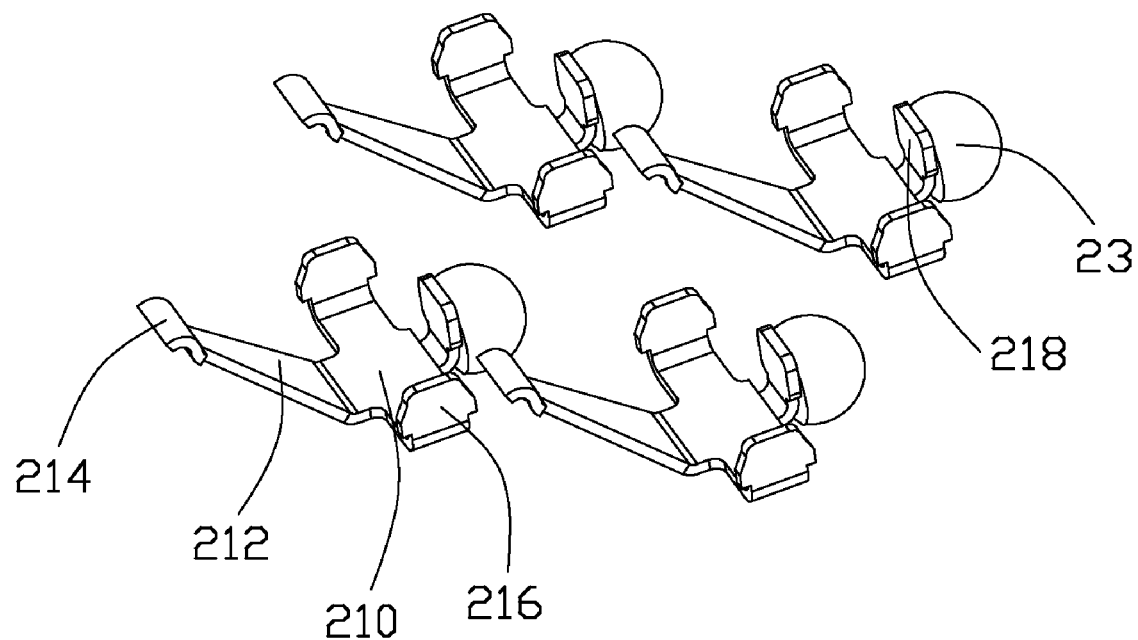
FIG. 11 is a perspective view of contacts of the socket in FIG. 9.

Referring to FIGS. 9-11, a socket 2 in accordance with a second preferred embodiment of present invention is disclosed. The socket 2 has an insulative housing 20 and a plurality of contacts 21 received in the insulative housing 20. The insulative housing 20 defines a plurality of holes 201 for receiving the contacts 21 and a plurality of retaining slots 202 around the holes 201. The contact 21 has a horizontal main body 210, an oblique arm 212 with a contacting portion 214 at the top thereof and a pair of retaining tabs 216. All these features are same as the contact 11 and the insulative housing 10 of the socket 1 in the first preferred embodiment, respectively, here will not give unnecessary details. When the contact 21 is assembled to the insulative housing 20, the horizontal main body 210 is mounted below a bottom surface 204 of the insulative housing 20, the oblique arm 212 is received in the holes 201 and extends beyond a top surface 205 of the insulative housing, and the retaining tabs 216 inserts into the retaining slots 202 to retain the contact 21 on the insulative housing 20. The special of the contact 21 is that it further has a mounting tail 218 bent upwardly from a rear edge of the main body 210, a solder ball 23 is attached to an outside face of the mounting tail 218. The insulative housing 20 correspondingly has a plurality of slot 203 to receive the mounting tails 218 of the contacts 21 and the solder balls 23. Since the retaining tabs 216 does not bring an additional size to the height of the whole contact 21, the contact 21 and the socket 2 can have a lower configuration.

Figure 12:
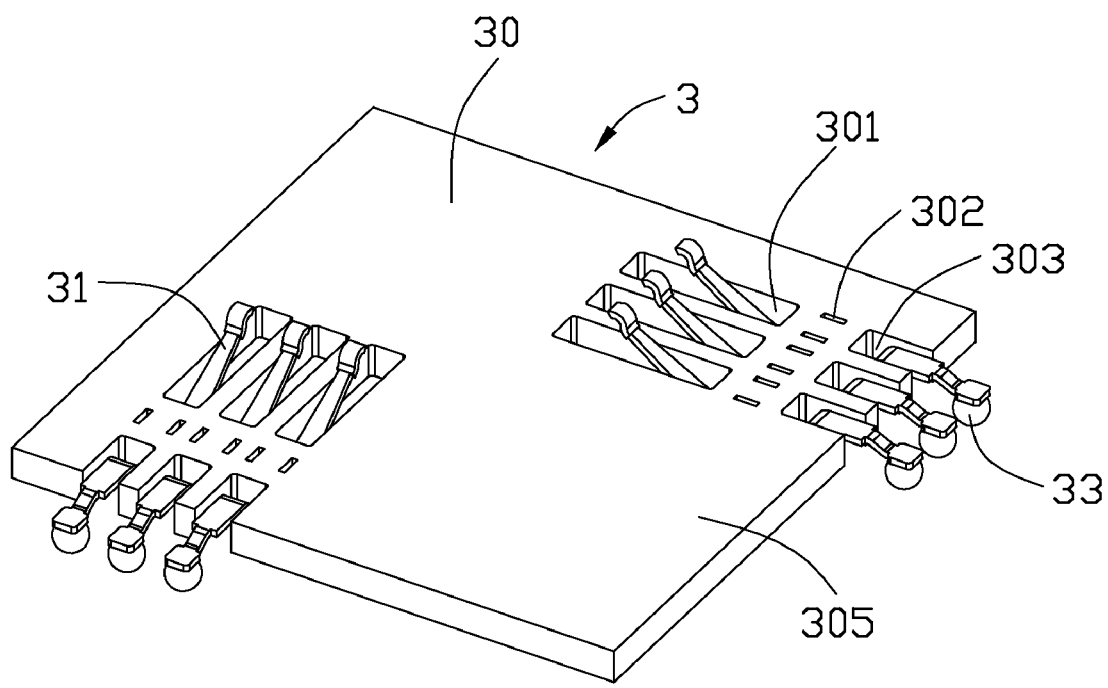
FIG. 12 is an assembled, perspective view of a socket in accordance with a third preferred embodiment of present invention.
Figure 13:
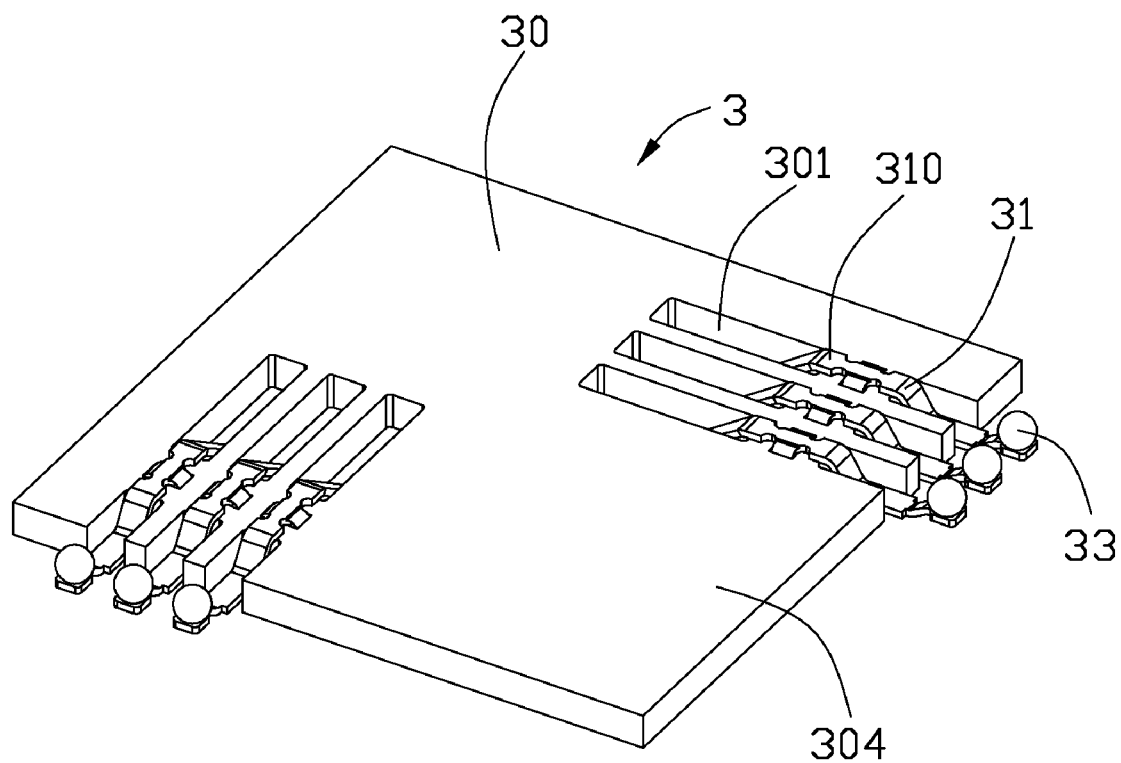
FIG. 13 is another perspective view of the socket in FIG. 12.
Figure 14:
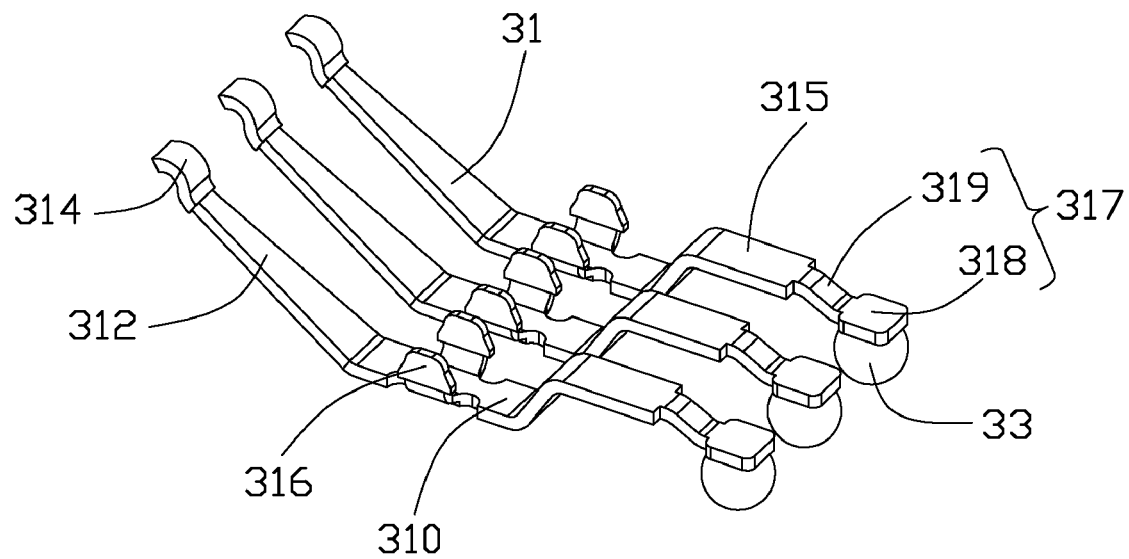
FIG. 14 is a perspective view of contacts of the socket in FIG. 12.

Referring to FIGS. 12-14, a socket 3 in accordance with a third preferred embodiment of present invention is disclosed. The socket 3 has an insulative housing 30 and a plurality of contacts 31 received in the insulative housing 30. The insulative housing 30 defines a plurality of holes 301 for receiving the contacts 31 and a plurality of retaining slots 302 around the holes 301. The contact 31 has a horizontal main body 310, an oblique arm 312 with a contacting portion 314 at the top thereof and a pair of retaining tabs 316. Similar with the contacts 11, 21 and the insulative housings 10, 20 of the sockets 1, 2 in the first and the second preferred embodiments, when the contact 31 is assembled to the insulative housing 30 from the bottom to the top, the horizontal main body 310 faces to a bottom surface 304 of the insulative housing 30, the oblique arm 312 is received in the holes 301 and extends beyond a top surface of the insulative housing 30, and the retaining tabs 316 insert into the retaining slots 302 to retain the contact 31 on the insulative housing 30. The contact 31 further has a bridge portion 315 extending rearward from a rear edge of the main body 310 and a mounting tail 317 extending from the bridge portion 315. The insulative housing 30 correspondingly has a plurality of slots 303 defined around a peripheral thereof to accommodate the bridge portions 315. The bridge portion 315 extends upwardly firstly and then horizontally to spread beyond the slots 303 of the insulating housing 30. The mounting tail 317 has a horizontal piece 318 and an inclined portion 319 linking the horizontal piece 318 and the bridge portion 315. A solder ball 33 is attached to a bottom surface of the horizontal piece 317. Since neither the retaining tab 316 nor the bridge portions 315 will bring an additional size to the height of the whole contact 31, the contact 31 and the socket 3 can have a lower configuration.

Figure 15:
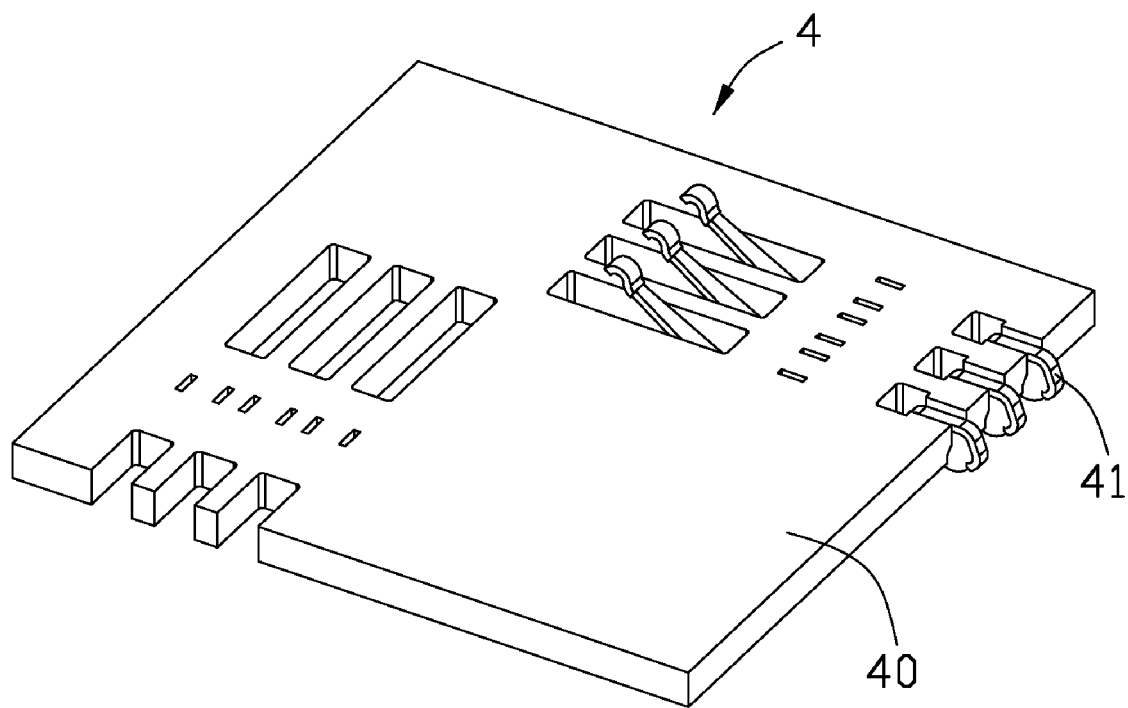
FIG. 15 is an assembled, perspective view of a socket in accordance with a fourth preferred embodiment of present invention.
Figure 16:
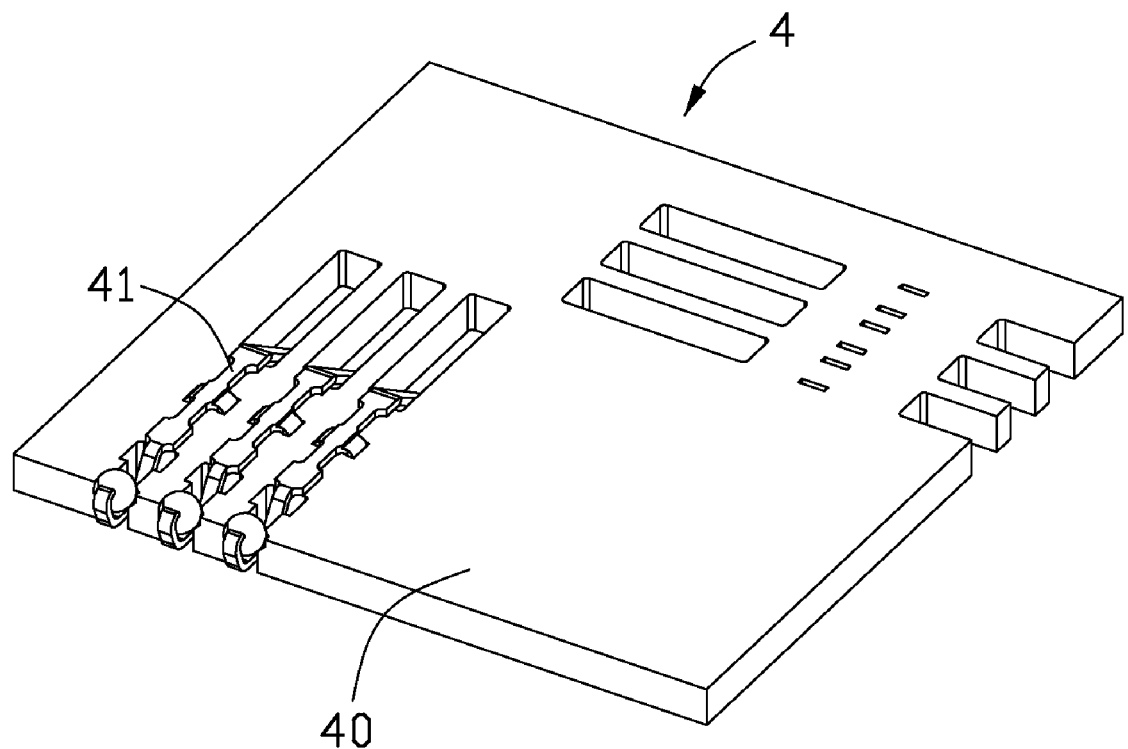
FIG. 16 is another perspective view of the socket in FIG. 15.
Figure 17:
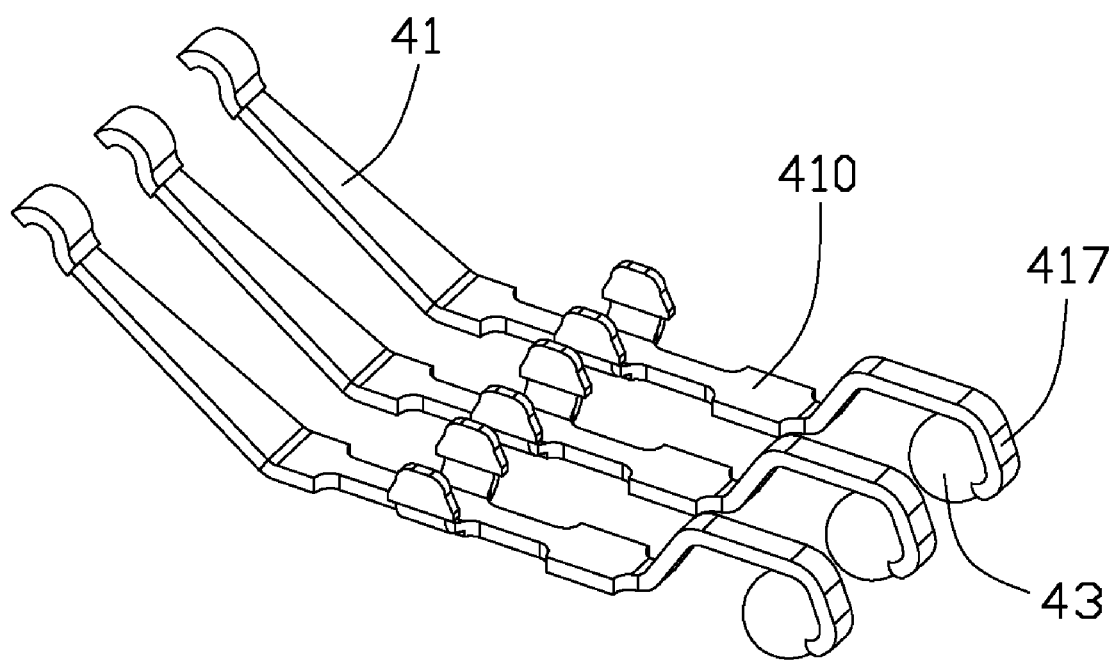
FIG. 17 is a perspective view of contacts of the socket in FIG. 16.

Referring to FIGS. 15-17, a socket 4 in accordance with a fourth preferred embodiment of present invention is disclosed. The socket 4 has an insulative housing 40 substantial same as the insulative housing 30 in the third embodiment, and a plurality of contacts 41 received in the insulative housing 40. The contact 41 is also similar as the contact 31 in the in the third embodiment, except that a mounting tail 417 of the contact 41 has a different shape relative to the mounting tail 317 of contact 31 and a length of a horizontal main body 310 is longer than that of the horizontal main body 310 of the contact 31. The mounting tail 417 is a claw shape to clasp a solder ball 43. Here will not give unnecessary details about the other portions of the contact 41 and the configuration of the insulative housing 40.

Figure 18:
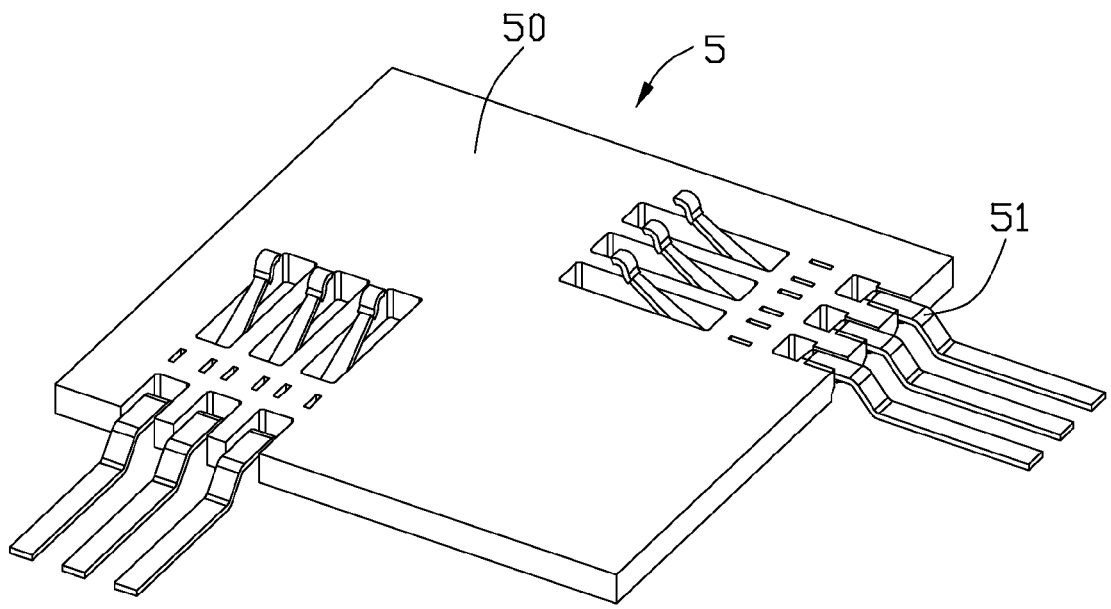
FIG. 18 is an assembled, perspective view of a socket in accordance with a fifth preferred embodiment of present invention.
Figure 19:
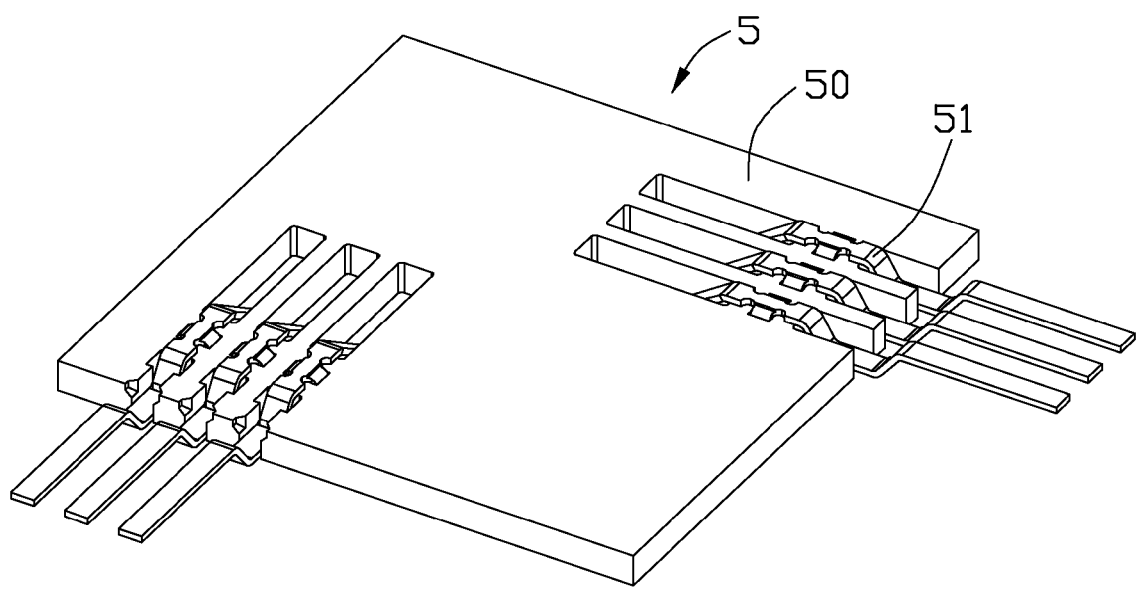
FIG. 19 is another perspective view of the socket in FIG. 18.
Figure 20:
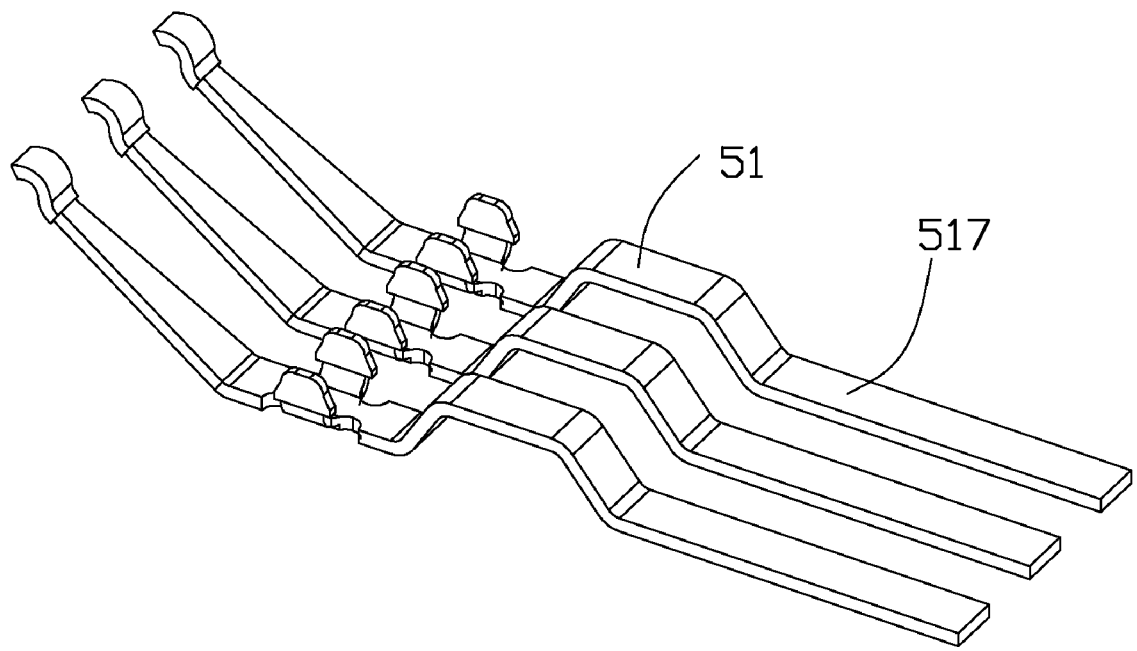
FIG. 20 is a perspective view of contacts of the socket in FIG. 18.

Referring to FIGS. 18-20, a socket 5 in accordance with a fifth preferred embodiment of present invention is disclosed. The socket 5 has an insulative housing 50 same as the insulative housing 30 in the third embodiment, and a plurality of contacts 51 received in the insulative housing 40. The contact 51 is also similar as the contact 31 in the in the third embodiment, except that a mounting tail 517 has a longer length and is disposed lower to directly mount to the printed circuit board (not shown). No solder ball is needed.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket, for connecting an IC (integrated circuit) package to a printed circuit board, comprising:
   an insulative housing defining a plurality of holes and a plurality of retaining slots, the holes arranged in rows along a front to back direction; and
   a plurality of contact, the contact having a horizontal main body, an oblique arm extending upwardly and forwardly from a front edge of the horizontal main body with a contacting portion at a top thereof and a pair of retaining tabs extending upwardly from two opposite lateral edges of the horizontal main body, respectively, the contact assembled to the insulative housing along a bottom to top direction, the horizontal main body facing to a bottom surface of the insulativre housing, the oblique arm received in the hole and the retaining tabs interfering with the retaining slots of the insulative housing to retain the contact on the insulative housing, wherein with respect to two retaining slots and a corresponding hole engaging with same one contact, the two retaining slots are disposed behind the corresponding hole and are not overlapped with the corresponding hole along the front to back direction.

2. The socket as described in claim 1, wherein a solder ball is attached to a bottom of the horizontal main body, and the contacts disposed in two adjacent rows are staggered.

3. The socket as described in claim 1, wherein the contact has a curved tail extending downwardly and rearward from a rear edge of the main body for contacting the printed circuit board.

4. The socket as described in claim 1, wherein the main body of the contact is provided with a dimple in a center thereof for contacting with the printed circuit board.

5. The socket as described in claim 4, wherein the contact has a mounting tail bent upwardly from a rear edge of the main body and extending upright, a solder ball is attached to an outside face of the mounting tail.

6. The socket as described in claim 5, wherein the insulative housing correspondingly has a plurality of slots to receive the mounting tails of the contacts and the solder balls.

7. The socket as described in claim 1, wherein the contact further has a bridge portion extending rearward from a rear edge of the main body and a mounting tail extending from the bridge portion, the insulative housing correspondingly has a plurality of slots defined around a peripheral thereof to accommodate the bridge portions.

8. The socket as described in claim 7, wherein the bridge portion extends upwardly firstly and then horizontally, and the mounting tail has a solder ball associated therewith.

9. A socket for connecting an IC (integrated circuit) package to a printed circuit board, comprising:
an insulative housing defining a plurality of holes and a plurality of retaining slots; and
a plurality of contact assembled to the insulative housing, the contact having a horizontal main body, an oblique arm extending forwardly and upwardly from a front edge of the horizontal main body with a contacting portion at the top thereof and two retaining tabs extending upwardly from two opposite lateral edges of the horizontal main body without the oblique arm, the horizontal main body abutting against a bottom surface of the insulative housing, the oblique arm received in the hole and the two retaining tabs engaging with the retaining slots of the insulative housing to retain the contact on the insulative housing, wherein
the oblique arm is deflectable around a jointing edge between the oblique arm and the main body when be pressed downwardly, and the joining edge is coplanar to the main body.

10. The socket as described in claim 9, wherein the main body electrically connects with the printed circuit board by a dimple formed thereon or a solder ball.

11. The socket as described in claim 9, wherein the contact further has a tail extending from a rear edge of the main body opposite to the oblique arm for contacting with the printed circuit board or mounting a solder ball.

12. The socket as described in claim 11, wherein the insulative housing correspondingly has a plurality of slots to receive the tails.

13. The socket as claimed in claim 9, wherein the horizontal main body is substantially hidden under the bottom surface of the insulative housing.

14. A socket comprising:
an insulative housing being essentially of a plate having opposite upper and lower surfaces thereof;
a plurality of contact receiving sets formed in the housing and roughly side by side arranged with one another along a transverse direction while each of said contact receiving sets spans in a lengthwise direction perpendicular to said transverse direction and defines at least an elongated through hole and at least one retaining slot spaced and isolated from said through hole in said lengthwise direction;
a plurality of contacts disposed in the corresponding contact receiving sets, respectively, the housing and the contacts being configure to allow each of said contacts to be only upwardly assembled to the housing,
each of said contacts including an elongated resilient contacting section extending obliquely from around the lower surface into the corresponding through hole and further beyond the upper surface, and at least one upwardly extending retaining tab securely received in said retaining slot, and a main body located around the lower surface and connecting to both said contacting section and the retaining tab, respectively.

15. The socket as claimed in claim 14, wherein a vertical dimension of said retaining tab is essentially equal to a thickness of the housing.

16. The socket as claimed in claim 14, wherein each of said contacts is further equipped with a solder ball at one end opposite to the contacting section in said lengthwise direction under condition that said solder ball is essentially located at a same level with the retaining tab.

17. The socket as claimed in claim 16, wherein each of said contacts receiving sets further includes a cavity to receive the corresponding solder ball therein.

18. The socket as claimed in claim 14, wherein each of said contacts further includes another retaining tab opposite to said retaining tab in said transverse direction, and each of said contact receiving sets further includes another retaining slot to receive said another corresponding retaining tab.

19. The socket as claimed in claim 14, wherein the retaining slot extends through both the upper and the lower surfaces so as to have the corresponding retaining tab downwardly viewable and checkable from an exterior.

20. The socket as claimed in claim 14, wherein the contact receiving sets are essentially arranged in a staggered manner in the lengthwise direction.

* * * * *